(12) United States Patent
Schuster

(10) Patent No.: US 7,203,007 B2
(45) Date of Patent: Apr. 10, 2007

(54) PROJECTION EXPOSURE MACHINE COMPRISING A PROJECTION LENS

(75) Inventor: Karl-Heinz Schuster, Königsbronn (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 10/915,972

(22) Filed: Aug. 11, 2004

(65) Prior Publication Data

US 2005/0030634 A1  Feb. 10, 2005

Related U.S. Application Data

(63) Continuation-in-part of application No. 09/847,658, filed on May 2, 2001, now Pat. No. 6,867,923.

(30) Foreign Application Priority Data

May 4, 2000 (DE) ................................ 100 21 739

(51) Int. Cl.
*G02B 9/00* (2006.01)
*G02B 3/08* (2006.01)
*G03B 27/54* (2006.01)

(52) U.S. Cl. ......................... 359/649; 359/739; 355/67

(58) Field of Classification Search ........ 359/649–651, 359/738–740, 754; 355/67
See application file for complete search history.

(56) References Cited

U.S. PATENT DOCUMENTS

| 4,676,614 A | 6/1987 | Ohno ........................ 353/101 |
| 4,699,505 A | 10/1987 | Komoriya et al. ............ 355/30 |
| 4,780,747 A | 10/1988 | Suzuki et al. ................. 355/68 |
| 4,871,237 A | 10/1989 | Anzai et al. ................ 359/666 |
| 4,961,001 A | 10/1990 | Liegel et al. ............ 250/491.1 |
| 4,974,018 A | 11/1990 | Komoriya et al. ............ 355/53 |
| 5,025,284 A | 6/1991 | Komoriya et al. ............ 355/53 |
| 5,337,097 A | 8/1994 | Suzuki et al. ............... 353/101 |
| 5,805,344 A * | 9/1998 | Sasaya et al. ............... 359/649 |
| 5,852,490 A | 12/1998 | Matsuyama .................. 355/67 |
| 5,969,802 A | 10/1999 | Takahashi et al. ............ 355/67 |
| 6,235,438 B1 | 5/2001 | Suzuki et al. ................. 430/30 |
| 6,333,776 B1 | 12/2001 | Taniguchi ..................... 355/52 |
| 6,788,471 B2 * | 9/2004 | Wagner et al. .............. 359/649 |
| 6,867,923 B2 * | 3/2005 | Singer et al. ............... 359/667 |
| 6,891,596 B2 * | 5/2005 | Rostalski et al. ............. 355/53 |
| 2002/0033934 A1* | 3/2002 | Ishii ............................ 355/30 |
| 2003/0020888 A1 | 1/2003 | Tanaka et al. ................ 355/30 |
| 2003/0174408 A1* | 9/2003 | Rostalski et al. ........... 359/642 |

* cited by examiner

*Primary Examiner*—Scott J. Sugarman
*Assistant Examiner*—M. Hasan
(74) *Attorney, Agent, or Firm*—Welsh & Katz, Ltd.

(57) ABSTRACT

A projection exposure machine comprises a projection lens with a lens arrangement and at least one stop. The lens arrangement comprises a group of optical elements which is arranged between the stop and the image plane. An optical element of the group situated close to the image plane has a thickness of at least 6.5% of the entire stop diameter.

75 Claims, 6 Drawing Sheets

PROJECTION EXPOSURE MACHINE COMPRISING A PROJECTION LENS

This application is a CIP of Ser. No. 09/847,658 May 2, 2001 U.S. Pat. No. 6,867,923.

BACKGROUND OF THE INVENTION

1. Field of the Invention

The invention relates to a projection exposure machine in microlithography comprising a projection lens with a lens arrangement. The invention also relates to a manipulation chamber for correcting field curvature and a method for tuning projection lenses.

Reference is made to U.S. Pat. No. 4,871,237, U.S. Pat. No. 4,676,614 and U.S. Pat. No. 5,559,584 for details on the general prior art.

2. Description of the Related Art

In the case of lithographic lenses, spherical aberration, inter alia, arises as image error owing to environmental influences, such as change in air pressure, for example. Other parameters are lens heating and compaction, which likewise lead to spherical aberration. Particularly in the case of a high numerical aperture, the absolute value of the spherical aberration becomes very large and no longer tolerable given the required accuracies.

In addition to U.S. Pat. No. 4,871,237, mentioned at the beginning, it is known to compensate barometric and weather-induced pressure changes by wavelength changes in the case of DUV lenses. However, for 365 nm, 193 nm lenses this method no longer functions and specifically the chromatic correction of the lenses, that is to say the use of different materials, causes the different variation in the refractive indices with the wavelength to lead to image errors which cannot be tolerated.

Furthermore, it is known to compensate residual errors, caused by environmental influences, by using z manipulators, that is to say lens elements which can be actively displaced in the direction of the optical axis. However, it is disadvantageous of this method that in addition to the large outlay required therefore other errors are once again introduced thereby as well.

It is therefore common to all known methods that they more or less effectively compensate spherical aberration but at the same time once again introduce other errors, or act only incompletely. A complicating factor is added when the optical materials used, in particular lenses, consist of different materials such as, for example, calcium fluoride and quartz glass, because this gives rise to differently varying refractive indices over the wavelength, should it be desired to manipulate over the wavelength.

SUMMARY OF THE INVENTION

It is the object of the present invention to create a projection lens which has with fewer lenses a very good quality, in particular also in the case of a high aperture, it also being desirable to provide correction options at the same time. It is desired, in particular, to permit correction of the constant field component of a spherical aberration.

According to the invention, this object is achieved by the features of claim 1.

Claims 38 and 64 indicate further achievements of the object.

Claim 78 describes a manipulation chamber in a projection lens for correcting field curvature.

Claim 82 demonstrates a method for tuning projection lenses.

The construction according to the invention of an optical element, which more or less has a shape which is at least approximately plane-parallel, and the specified thickness, which is greater by comparison with known optical elements such as, for example, an end plate of a lens yield the advantage that, for example, owing to the plane-parallelism of the optical element over the field there is only an insubstantial variation in image errors arising from the thick element. This element therefore reacts virtually identically over the image field, because the lens is substantially telecentric in this region. Since this optical element has no radii of curvature or at least none worth mentioning, no radii can exert an unfavorable field influence in any way at all, in particular when the field increases or the aperture increases, for example. In other words: the optical element having the dimensions according to the invention leads to very slight image error variations over the image field, and this means that specific field-dependent aberrations in the widely opened lens can be better predicted in principle and can in this way be corrected more efficiently further at the front or as early as in the input region of the optical system. The optical element with the dimensions according to the invention relieves the system correction by the so-called spherical overcorrection. Small working distances from the image likewise have a relieving effect on the image error correction and are very advantageous. Small working distances, for example only 2 mm instead of 10 mm, cannot be implemented everywhere, however. The optical element indicated then permits large working distances to be realized without disadvantages.

A very advantageous and not obvious development of the invention in the use of the optical element in the sixth lens group with the specified radii of curvature and diameter/thickness ratios consists in that an optical element having optical refractive power is provided in the first lens group, the optical element having optical refractive power having an aspheric.

Corrections, such as the removal of shell errors and the correction of telecentricity, for example, can be achieved with the aid of the aspheric according to the invention as early as in the input region of the lens. This holds, in particular, in the case of very widely opened lenses, in particular when the aspheric is fitted as near as possible to the input of the lens, at least in front of the first bulge, at best already on the first curved surface.

It is thereby possible according to the invention to achieve numerical apertures on the image side of at least 0.75, it being possible, nevertheless, still to fit a very thick optical element on the output side, for example a thick end plate. Since an optical element in accordance with claim 1 no longer experiences variations over the image field, it is possible, for example, to predict the aberration, that is to say how it develops in the lens in the case of increasing field loading and/or increasing aperture. The aspheric according to the invention arranged in the first lens group can be used to influence and/or correct the aberrations image field shells and telecentricity correspondingly. This can be done here in an advantageous way in a region in which the numerical aperture is still relatively small. In this case, the full bundle diameter preferably remains as small as possible with respect to the free lens diameter used.

When, in a very advantageous embodiment of the invention, it is provided that a first optical element and a second optical element of the sixth optical group enclose a gas chamber, in which case it holds for the radius of curvature R3 of the first surface of the second optical element, which faces the first optical element, that: R3>3000 mm, preferably >5000 mm, this produces a quasi plane-parallel gas chamber which can be used as manipulation chamber in a very advantageous way for the invention.

The bundle of light can be even more effectively separated when the optical element having optical refractive power and the aspheric is arranged upstream of the first bulge in the light direction.

According to the invention, the sixth optical group can consist only of plane-parallel plates. Of course, it is also possible to provide one or two optical elements in the sixth optical group, in which case at least one optical element should then have an at least approximately planar surface which is situated adjacent to a further plane-parallel surface, for example an end plate, so that a manipulation chamber can then be formed therebetween.

It is also advantageous when optical elements in the sixth lens group and, if appropriate, also in the fifth lens group, that is to say the optical elements which are situated nearest a wafer or a substrate in microlithography, have only a positive refractive power. At least two or three appropriate optical elements will preferably be arranged at this point.

By means of the inventive manipulation chamber according to claim 78, a manipulable gas interspace is provided in a projection lens. A gas or a gas mixture is introduced into the manipulation chamber, the refractive power being varied by changing the gas mixture or else by a pressure change. The manipulation chamber can advantageously be provided with a low refractive power, that is to say, that at least one surface delimiting the manipulation chamber in the direction of the optical axis of the projection lens is provided with a slight curvature. It is possible in this way to change any field curvature arising on the substrate or wafer to be exposed. Specifically, imaging as accurately as possible on the flat substrate requires the absence of any field curvature. If, for example, the field curvature changes owing to lens warming, this disadvantageous field curvature can now be removed according to the invention by the manipulable gas interspace. This holds, in particular, whenever the latter is arranged as close as possible to the substrates to be exposed. At the same time, it is thereby avoided that other errors are produced again thereby.

In a method for tuning projection lenses according to claim 82 an offset of the refractive index is set in advance via a specific initial gas mixture, in order to permit changes in refractive index in both directions, that is to say raising and lowering it.

In order to tune projection lenses, a closed chamber is advantageously provided, which is filled with a gas. This chamber may be referred to as a manipulation chamber. If the refractive index is changed in this manipulation chamber, spherical aberration (constant field characteristic) is introduced virtually exclusively. The change in the refractive index is achieved according to the invention by the selected composition of the gas or gas mixture to be introduced into the manipulation space, and/or of the pressure. In order not to introduce any new errors by additional pressure, for example by sagging of the surfaces delimiting the manipulation chamber, the elements closing off the manipulation chamber must correspond to the specified diameter/thickness ratios.

Exemplary embodiments of the invention will be described below in more detail with the aid of the drawings.

It is true that only purely refractive lenses are shown in the exemplary embodiments illustrated, but this invention is not limited to refractive systems, but can also read on catadioptric systems.

DETAILED DESCRIPTION

Figure 1:
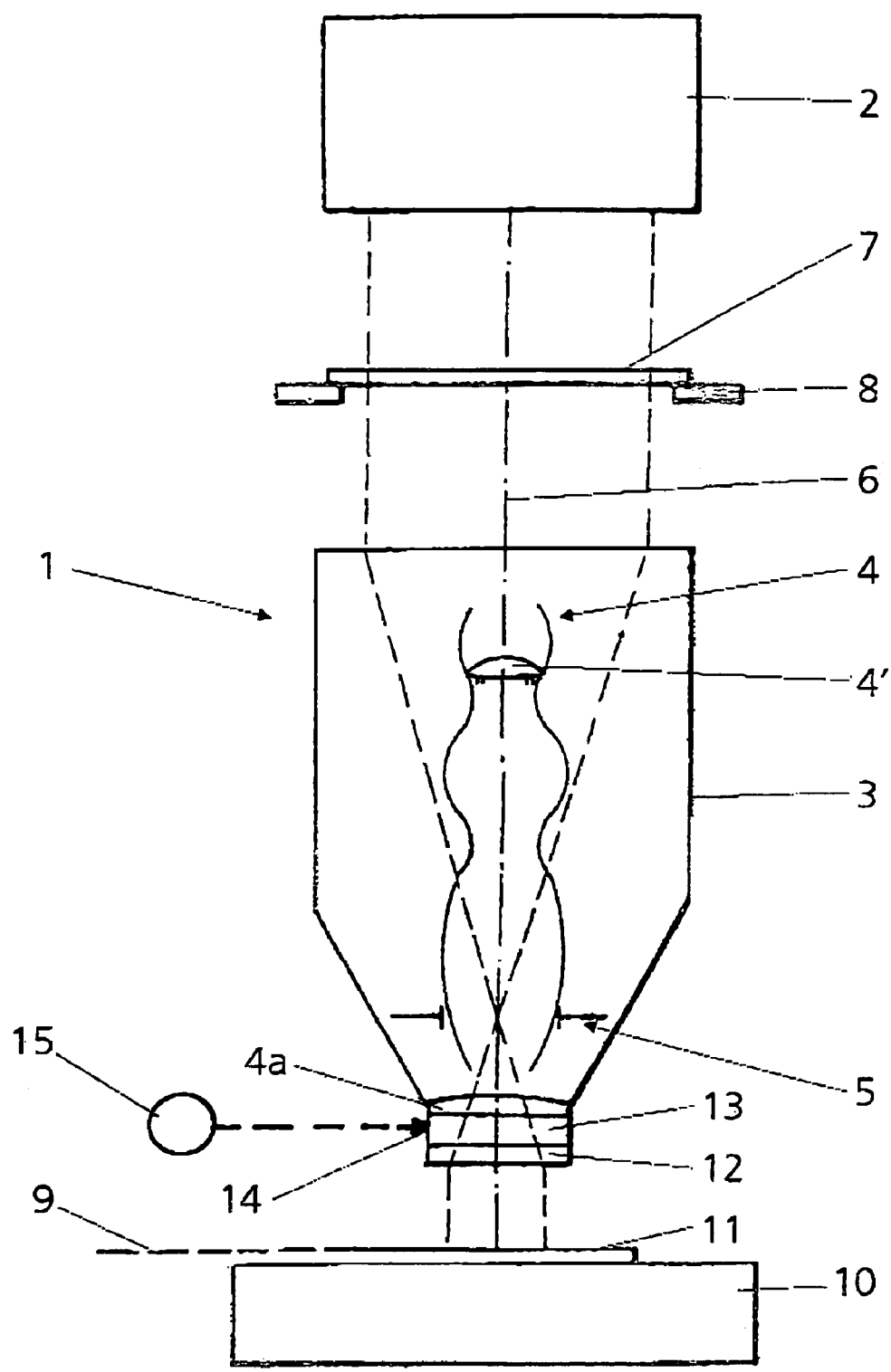
FIG. 1 shows a diagrammatic illustration of a projection exposure machine according to the invention having a projection lens.

The principle of the design of a projection exposure machine 1 is described below with the aid of FIG. 1. The projection exposure machine 1 has an illuminating device 2 and a projection lens 3. The projection lens 3 comprises a lens arrangement 4 with a multiplicity of lenses 4' (not illustrated in more detail in FIG. 1) and an aperture stop 5. The lenses 4' are arranged along an optical axis 6. A mask or reticle 7, which is held in the beam path by means of a mask holder 8, is arranged between the illuminating device 2 and the projection lens 3. The mask 7 is imaged on an image plane 9 by means of the projection lens 3 by a clearly reduced factor. Such masks 7 used in microlithography have a micrometer or nanometer structure which is imaged on the image plane 13 by means of the projection lens 3 in a fashion reduced in size down to a factor of 10, in particular the factor 4. The minimum structures which can still be resolved depend on the wavelength $\lambda$ of the light used for the illumination, and on the aperture of the aperture stop 5, the maximum achievable resolution of the projection exposure machine rising with decrease in the wavelength of the illuminating device 2 and with increasing aperture of the projection lens 3.

A substrate or a wafer 11 positioned by means of a substrate holder 10 is held in the image plane 9.

The termination of the projection lens 3 in the direction of the wafer 11 forms a flat end plate 12. A last lens 4a of the lens arrangement 4 is located at a spacing from the end plate 12. A manipulation chamber 13, which is sealed off from the surrounding parts, is thereby created between the end plate 12 and the last lens 4a. As may be seen, the side of the last lens 4a facing the end plate 12 is likewise flat, the result being to surrender the manipulation chamber 13 plane-parallel. Of course, it is not mandatory for the side of the last lens 4a facing the end plate 12 to be absolutely plane-parallel. Given appropriately large lens radii, for example with radii R>3000 mm, preferably >5000 mm, plane-parallelism is likewise achieved, as it were, and it is thereby possible to influence the production of the spherical aberration in the manipulation chamber 13 accordingly.

Figure 2:
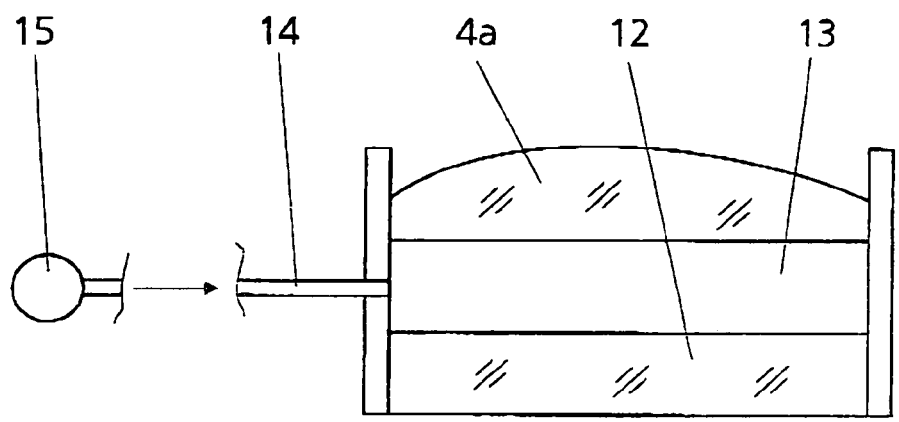
FIG. 2 shows a section through the lower part of the projection lens having an end plate and a lens adjacent thereto with a manipulation chamber therebetween, in an enlarged representation.

The manipulation chamber 13 is provided with a pressure connection 14 via which it can be connected to a gas source 15 (not illustrated in more detail) (see also enlarged illustration in FIG. 2).

By changing the gas composition, which is introduced into the manipulation chamber 13 starting from the gas source 15, and/or a pressure change, changes in refractive index are introduced into the projection lens 3, specifically shortly ahead of the outlet, and so no further imaging errors can be introduced any more. Changing the refractive index creates a spherical aberration which is used to compensate a spherical aberration occurring in the projection lens 3, or else to manipulate it in a desired direction.

Instead of a manipulation chamber between the end plate 12 and the last lens 4a adjacent thereto, it is also possible to achieve a plane-parallel manipulation chamber by dividing the end plate 12 into two. In this case, the two end plate parts 12a and 12b are arranged at a spacing from one another and form the manipulation chamber 13 between their plane-parallel surfaces. Of course, it is necessary in this case for the two end plate parts to be constructed with an appropriate thickness so that no bending occurs (see FIG. 3). A ratio of thickness d1 to diameter DU1 of 1:5, preferably 1:3 should be observed for this reason.

Figure 4:
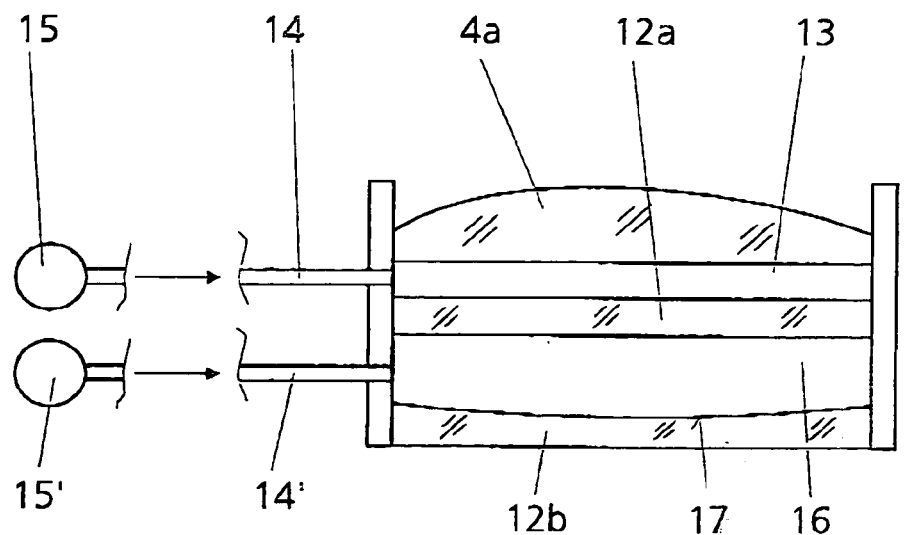
FIG. 4 shows an exemplary embodiment having a manipulation chamber and a further gas interspace, in an enlarged representation.

FIG. 4 shows an embodiment having an additional gas interspace 16 as well as the manipulation chamber 13, which is provided between a stop and an image plane 9. In order to achieve as high an efficiency as possible for the manipulator, the gas interspace 16 is arranged as near as possible to the wafer 11 such that in this case the manipulation chamber 13 lies correspondingly further to the rear. The gas interspace 16 is likewise created in this case by splitting the end plate 12 into two into the two plate parts 12a and 12b. The interspace 16 is likewise connected to a gas source 15' via a dedicated pressure connection 14'. By contrast with the manipulation chamber 13, however, at least one of the two surfaces of the manipulation chamber 16 which effect delimitation in the direction of the optical axis 6 of the projection lens 3 is provided with a slight curvature 17 in order to correct the field curvature on a substrate to be exposed.

If it is known that the projection lens is used at a specific barometric elevation, the following procedure is recommended:

Example:
  lens composed of different materials, for example $SiO_2$ and $CaF_2$;
  interspaces are filled with helium;
  there is air upstream and downstream of the lens Location of use at an elevation of 1700 meters with correspondingly reduced air pressure by comparison with the manufacturing location of the lens manufacturer. When the lens is being tuned at the manufacturer's, which is located, for example, at sea level or another lower elevation than that of the locations of use, the manipulation chamber is provided with a specifically set gas mixture whose refractive index is additionally lower than the refractive index at the location of use. The deeper lowering in the manipulation chamber in conjunction with the normal pressure between the lens and image plane then corresponds to the sum of the optical paths (n·d) at the elevation of use with a lower pressure in the manipulation chamber and the space between the lens and image plane. The helpfully lower refractive index is a function of the thickness ratio: geometrical thickness$_{manipulation\ chamber}$ to the geometrical thickness$_{space\ between\ lens\ and\ image\ plane}$:

$$d_M \cdot n_{L,1700m} + d_{ob} \cdot n_{L,1700m} = d_M \cdot n_{Mani} + d_{ob} \cdot n_{L,H},$$

$d_m$ being the geometrical thickness of the manipulation chamber, $d_{ob}$ being the geometrical thickness of the space between the last optical element of the lens and the image plane, $n_{L,1700m}$ being the refractive index of the gas in the manipulation chamber at the location of use, $n_{Mani}$ being the refractive index of the manipulation chamber to be manipulated, and $n_{L,H}$ being the refractive index of the gas in the space between the last optical element of the lens and the image plane.

In this way, the manipulation chamber can easily be filled later at the location of use with a conventional filling gas whose refractive index is pressure-dependent, for example synthetic air, oxygen or nitrogen, at the average pressure at the installation site, and this results in an exactly tuned lens. Natural weather-induced changes in air pressure are now compensated by small pressure changes in the manipulation chamber. The advantage of this method consists in that the customer need only fill the manipulation chamber with conventional filling gas, and only slight pressure differences need be set.

If it is not desired to stipulate where the later location of use should be, the conventional filling gas is used for tuning. However, it is then later necessary to use a gas mixture of higher refractive index at the location of use if the barometric level rises. However, in this case pressure changes owing to the weather are likewise compensated by small changes in the gas pressure in the manipulation chamber.

Figure 5:
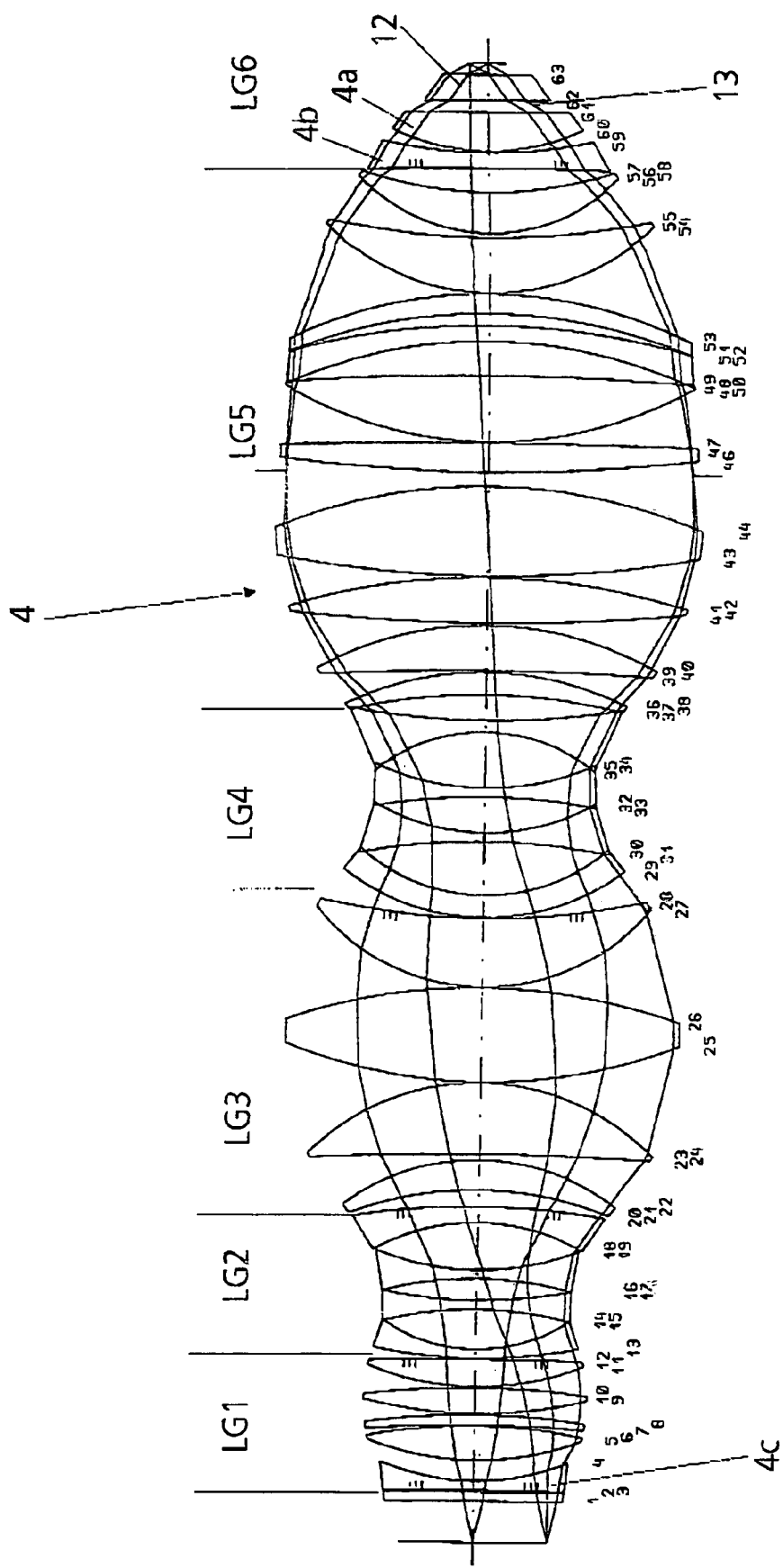
FIG. 5 shows a lens section through a first lens arrangement.
Figure 6:
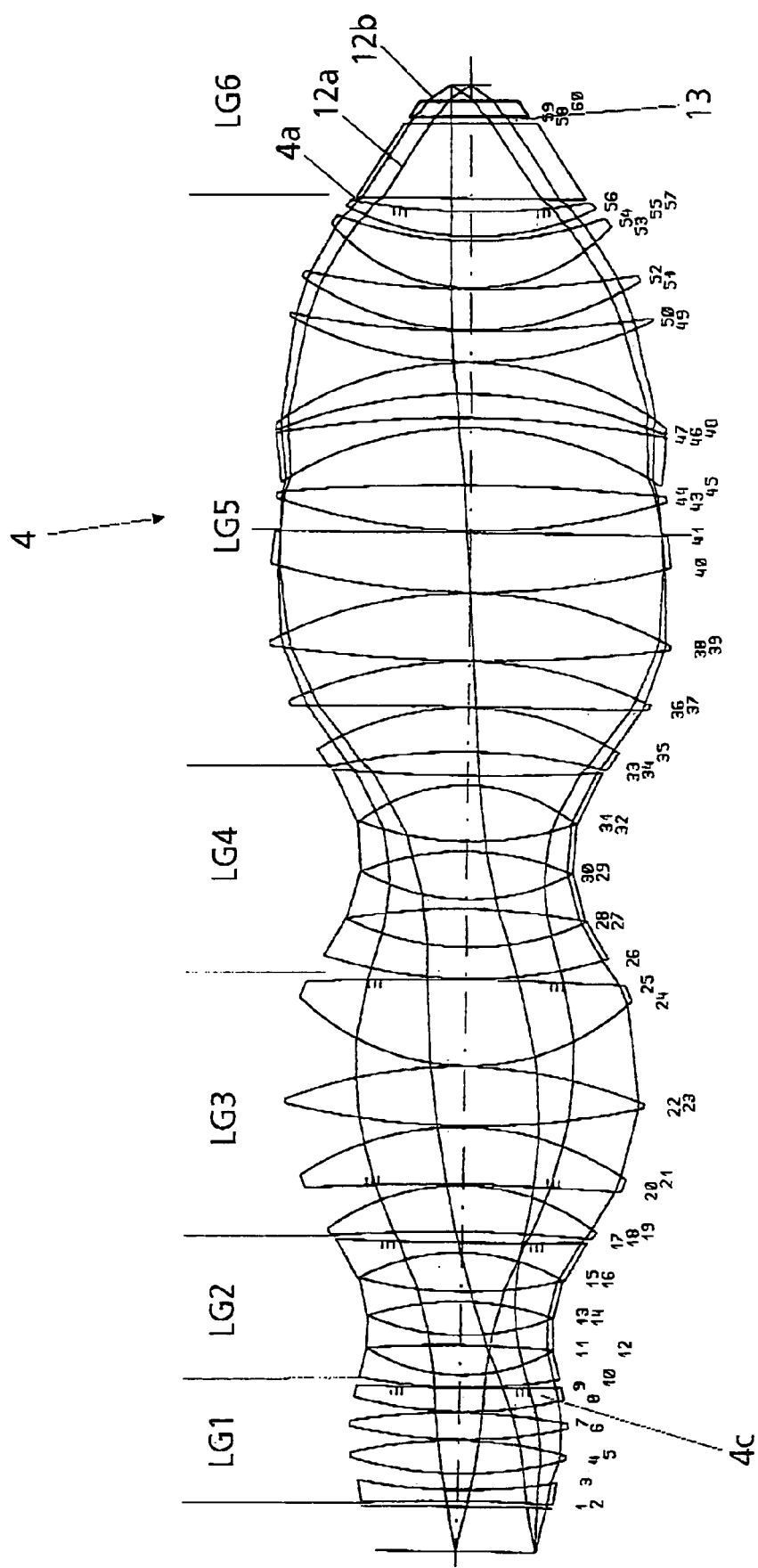
FIG. 6 shows a lens section through a second lens arrangement.

Sections through the lens arrangements are illustrated by the examples in FIGS. 5 and 6.

The exemplary embodiments relate to a projection lens 3 having a lens arrangement 4 which is subdivided into six optical groups (LG1 to LG6). The first, third and fifth lens groups have a positive refractive power, and the second and fourth lens groups respectively have a negative refractive power. The subdivision of the lens system into lens groups is set forth below in more detail, the basis having been provided as the directional propagation of the rays.

The first lens group LG1 is positive and terminates with a lens of positive refractive power. The first lens group forms a bulge, it being immaterial whether negative lenses are also arranged in the bulge.

The second lens group LG2 has an overall refractive power which is negative. This second lens group LG2 has as first lens a lens constructed on the image side with a concave lens surface. This second lens group LG2 essentially describes a waist. It is not important here, either, whether individual positive lenses are contained in the second lens group LG2, as long as the waist is maintained. The third lens group LG3 begins with a lens of positive refractive power which has on the image side a convex lens surface, and can be a meniscus. If a thick meniscus lens is provided as first lens, the separation of the lens groups can be conceived inside the lens.

The fourth lens group LG4 has a negative refractive power. This fourth lens group begins with a lens having a negative refractive power which is followed by a plurality of lenses with a negative refractive power. This lens group forms a waist. It is immaterial whether lenses having a positive refractive power are also arranged inside this lens group, as long as this influences the optical path only at a short distance, and so the waist shape of the fourth lens group is maintained.

The fifth lens group LG5 has an overall refractive power which is positive. The first lens of this fifth lens group LG5 has a convex lens surface on the image side. The fifth lens group LG5 forms a bulge.

The lens with the maximum diameter (the bulge), is followed by a further two positive lenses in the fifth lens group LG5, negative lenses also being permissible. The last lens of the fifth lens group LG5 has a concave lens surface on the image side.

The sixth optical group LG6 comprises the optical elements downstream of the fifth lens group up to the image plane.

Such projection lenses are used, in particular, in microlithography. They are known, for example, from US 2002/0149855, U.S. Pat. No. 6,349,005 B1, U.S. Pat. No. 6,683,729 B1, US 2003/0007253 and U.S. Pat. No. 6,522,484 B1 of the applicant and the prior art quoted there. These documents are also intended to be contained in this application.

These lenses in the first and sixth groups conventionally have air clearances which are delimited by a curved surface up to the air clearance between the object plane and first optical surface, and the air clearance between the last optical surface and image plane, at least on one side.

FIGS. 5 and 6 are of similar basic design. In FIG. 5, the manipulation chamber 13 is formed between the end plate 12 and the lens 4a in accordance with the principle illustrated in FIG. 4.

Figure 3:
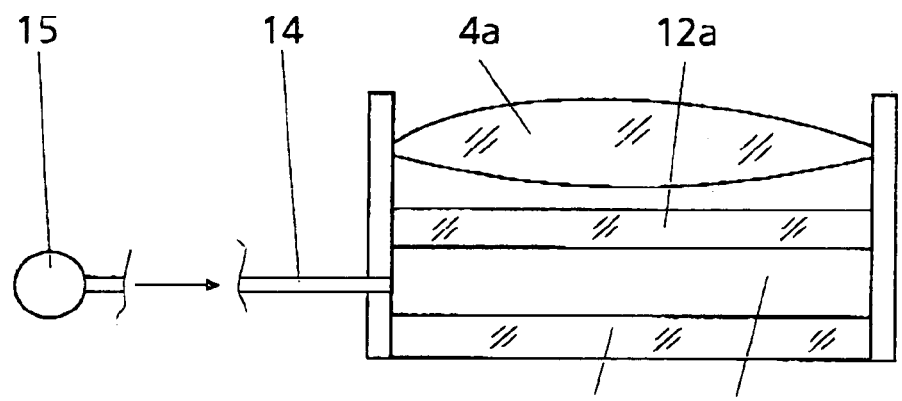
FIG. 3 shows a manipulation chamber which is formed by a bipartite end plate, in an enlarged representation.

In FIG. 6, the end plate is of bipartite construction, specifically having the parts 12a and 12b, and the manipulation chamber 13 is located therebetween, as may also be seen from the illustration of the principle in FIG. 3. A lens is no longer provided in the sixth group in the case of this exemplary embodiment.

A lens 4c, i.e. an optical element having optical refractive power and having an aspheric can be provided in the first lens group LG1. The lens 4c is situated closest to the object field in FIG. 5. The aspheric of the lens 4c faces the object field in the first lens group LG1 and can be arranged upstream of the first bulge in the light direction. A further optical element with an aspheric is likewise provided in the first lens group LG1. Further optical elements with aspherics are provided in the second lens group LG2, in the third lens group LG3 and in the sixth optical group LG6. The aspheric of the lens 4c in the first lens group LG1 is the first curved surface of the first lens group LG1, and is therefore situated closest to the object field.

The lens 4c with the aspheric is likewise arranged in the lens group LG1 in FIG. 6, the aspheric facing the image plane here. Further optical elements with aspherics are arranged in the second lens group LG2, in the third lens group LG3 and in the fifth lens group LG5. No optical element with an aspheric is provided in the sixth optical group.

Figure 7:
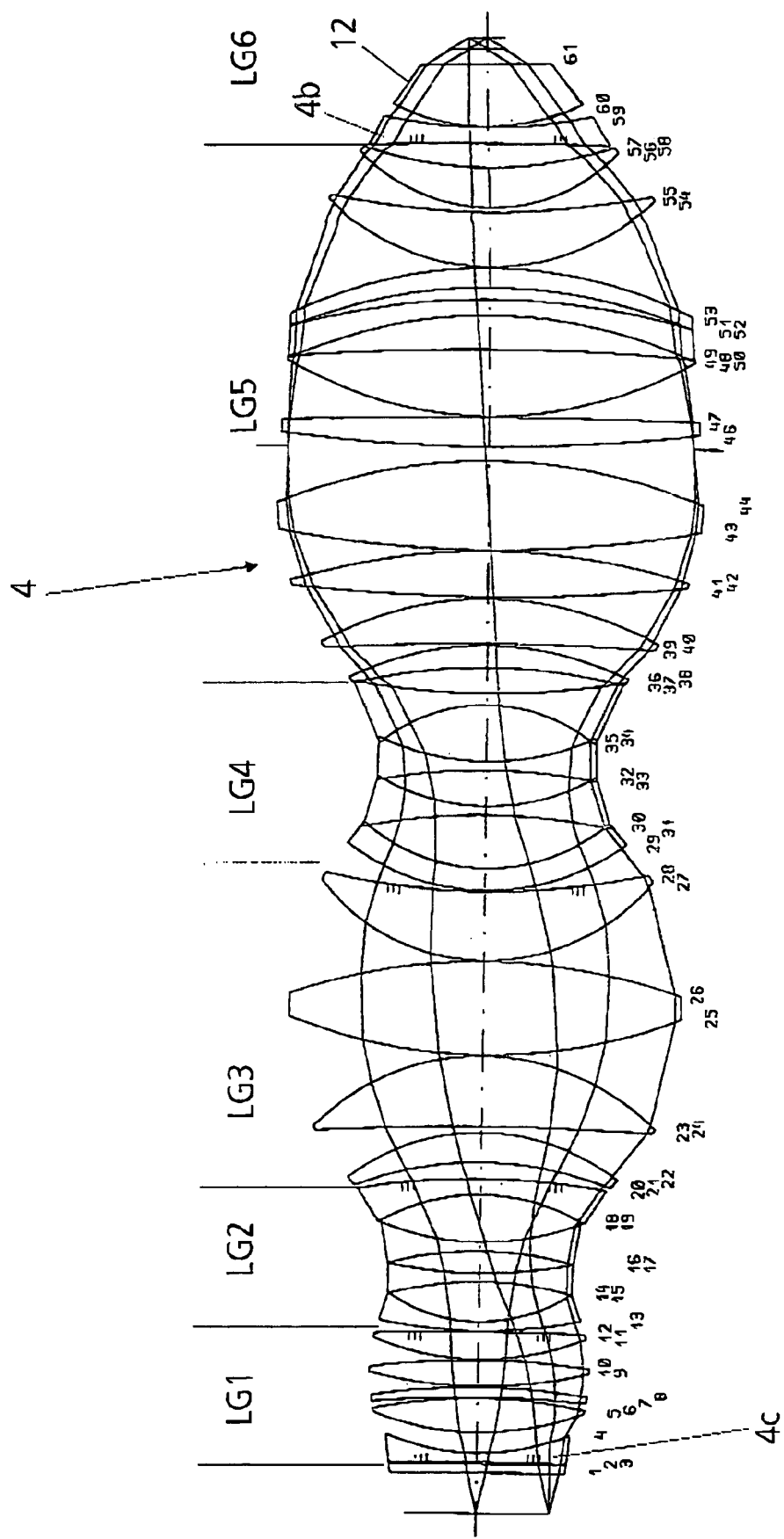
FIG. 7 shows a lens section through a third lens arrangement.

FIG. 7 shows a similar design to FIG. 5, the lens 4a and the plane-parallel plate 12 being illustrated, however, as an optical element 12.

Figure 8:
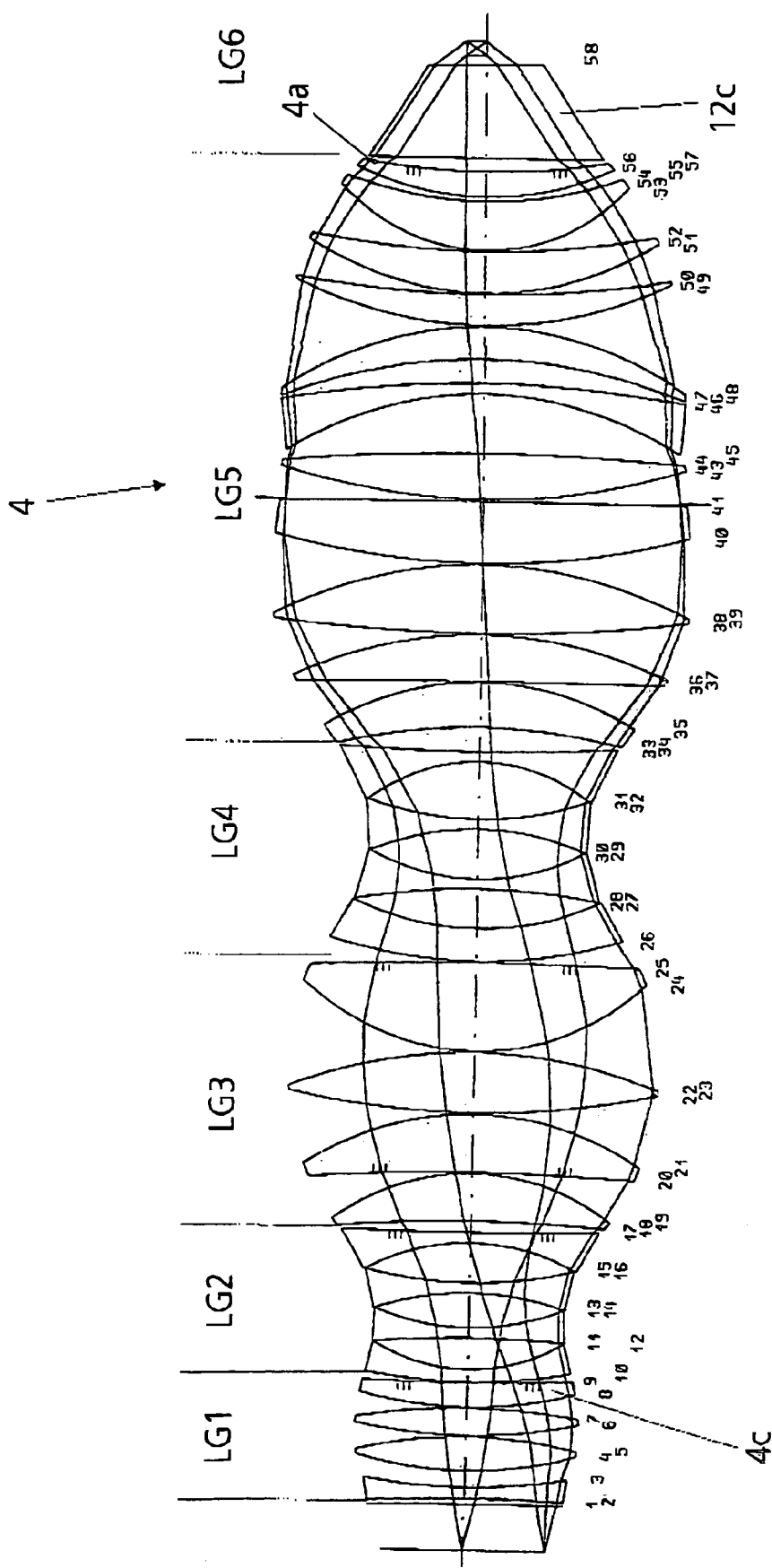
FIG. 8 shows a lens section through a fourth lens arrangement.

FIG. 8 shows a similar design to FIG. 6, the plane-parallel plates 12a and 12b having been combined to form a common optical element 12c. The projection lens 3 according to FIGS. 5, 6, 7 and 8 preferably has a numerical aperture of at least 0.75, preferably 0.85.

A laser which outputs radiation of wavelength shorter than 250 nm can be used as light source for microlithography.

As the case may be, a pattern contained on the mask 11 is appropriately structured after the development of the light-sensitive layer in the case of the production of microstructure components in which the substrate 11 provided with a light-sensitive layer is exposed to ultraviolet laser light by means of the mask 7 and the projection exposure machine 1.

FIG. 5 shows the ability to implement a lithographic lens as regards a manipulable plane-parallel air clearance in the outgoing part of the wafer. It has not so far been known to provide such a thick plane-parallel air clearance and a thick plane-parallel plate in a lens opened widely in such a way.

Aberrations which have so far been corrected in the descending region of the third bulge should now predominantly be corrected in the region of first bulge, first waist, second bulge. It has been found that this even exhibits clearly corrective advantages when the optical system is terminated with a thick plane-parallel plate in the case of the highest aperture. Consequently, this method was taken further where the thickness of the thick plate is clearly increased. In this case, the ratio of thickness to diameter should be at least 1:5. (The two plates act optically like a single thick plate).

FIG. 6 shows a design having a particularly thick plane-parallel plate. It constitutes the solution for three further problems at once.

Very high sine i loadings in the region upstream of the wafer are obtained when correcting highly opened lithographic lenses. The curvatures which the individual lenses can now assume, as a sphere, now cause aberrations with a much different effect between the edge and middle of the image field (including above the aperture). These are frequently effects which are searched for in the lens and which are particularly provided. Here, in the case of large yields and very high apertures, they can, however, become unmanageable, or certainly at least disturb the correction. The solution now actually constitutes a very thick plane-parallel plate which supplies the desired contribution from spherical overcorrection, but now acts in a completely isoplanatic fashion with reference to the image field. Aperture and image field can now be made very large.

In addition to the corrective advantage, it is also possible to reduce the number of lenses by collecting them to form a thick plano-convex lens 12 according to FIG. 7 or to form a thick plane-parallel plate 12c according to FIG. 8, nothing changing from an optical point of view. The optical element 12 according to FIG. 7 has a thickness of at least 6.5%, preferably 16.5% of the entire stop diameter. The plane-parallel plate 12c according to FIG. 8 has a thickness of at least 22% of the entire stop diameter. The plano-convex lens 12 and the plane-parallel plate 12c of the sixth optical group or else all optical elements of the sixth optical group or of the entire projection lens 3 have a refractive index n<1.6. The plano-convex lens 12 and the plane-parallel plate 12c likewise have a transmission for wavelengths of less than 300 nm. The number of lens surfaces with a very high angular loading such as is usual upstream of the wafer thereby decreases. The advantages are low costs and less reflection losses, and thus a higher transmission. This is important, in particular, for wavelengths of 157 nm and 193 nm. The thick plano-convex lens 12 or thick plane-parallel plate 12c are located in the highest-opened bundle and, owing to their mechanical stability, offer the highest surety of obtaining the correction state over the lifetime with respect to bending. A further aspect is that the thick plane-parallel plate 12c or the plano-convex lens 12 can substantially simplify the number of mounting parts in a region where it is known there is little space. Located upstream of the wafer are the most varied image detection sensors which closely adjoin the actual lithographic optical system. The thick plane-parallel plate also creates the possibility here of accommodating more aperture and/or more field within a specific design space. This is also to be seen in that it is then possible, for example, to prolong the use of the same sensor system for a further generation.

A thick plate, thick plates or plano-convex lenses upstream of the wafer are therefore the solution according to the invention for
- a pressure manipulator upstream of the wafer in the lens,
- improved possibility for correction in conjunction with a very high aperture and large field,
- more aperture and field in conjunction with a given design space, and
- fewer highly loaded surfaces, more transmission.
- stability with respect to bending over the lifetime In the exemplary embodiment according to FIG. 5, on the first curved surface, the aspheric 4c takes over tasks which many lenses just upstream of the wafer have partly also taken over. However, the advantage here is now the extremely low angular loading on the first curved surface. At the same time, because of the good bundle separation it is possible to set a very specific effect with reference to the effect on image field shells and telecentricity between the middle of the image, the zone of the image field and the edge of the image field.

Since in the FIGS. 7 and 8 the manipulation chamber 13 is no longer present because of the lenses 4a and 12 or 12a and 12b being joined together, in microlithography, it is also possible in principle to provide a plane-parallel manipulation chamber between a last end plate of a projection lens and a wafer in which the refractive index can be varied by, pressure changes and/or changes in gas composition. For this purpose, the interspace between the end plate and the wafer is to be purged with purging gas of appropriate composition and at an appropriate pressure. It is also required in general for this purpose to "encapsulate" the entire projection lens.

The design arrangement for the lens arrangements illustrated in FIGS. 5, 6, 7 and 8 are to be specified below in each case by way of example. Of course, the features made concrete with the aid of exemplary embodiments and their combinations can be combined with one another.

Example according to FIG. 5:

Operating wavelength l = 193.3 nm
Diameter of the image field = 24.6 mm
Image-side numerical aperture NA = 0.85
Reduction ratio β = −0.25
Refractive index n(SIO2) = 1.5603
Refractive index n(CAF2) = 1.5014

| Surface | Radius | Aspheric | Thickness | Material | Diameter |
|---|---|---|---|---|---|
| OB |  |  | 32.000 | AIR |  |
| 1 | ∞ |  | 6.329 | SIO2 | 110.8 |
| 2 | ∞ |  | 1.383 | HE | 112.5 |
| 3 | −1393.131 | A | 6.329 | SIO2 | 112.8 |
| 4 | 153.737 |  | 14.539 | HE | 118.0 |
| 5 | 191.890 |  | 23.775 | SIO2 | 135.0 |
| 6 | −359.189 |  | 0.678 | HE | 136.5 |
| 7 | −827.276 |  | 7.196 | SIO2 | 137.7 |

-continued

Operating wavelength l = 193.3 nm
Diameter of the image field = 24.6 mm
Image-side numerical aperture NA = 0.85
Reduction ratio β = −0.25
Refractive index n(SIO2) = 1.5603
Refractive index n(CAF2) = 1.5014

| Surface | Radius | Aspheric | Thickness | Material | Diameter |
|---|---|---|---|---|---|
| 8 | −475.714 |  | 0.678 | HE | 138.8 |
| 9 | 296.346 |  | 18.036 | SIO2 | 141.7 |
| 10 | −561.014 |  | 0.678 | HE | 141.4 |
| 11 | 183.662 |  | 19.090 | SIO2 | 137.2 |
| 12 | −16545.560 | A | 0.694 | HE | 135.1 |
| 13 | 326.464 |  | 6.329 | SIO2 | 129.2 |
| 14 | 106.348 |  | 27.957 | HE | 118.2 |
| 15 | −235.452 |  | 6.329 | SIO2 | 117.5 |
| 16 | 304.109 |  | 15.255 | HE | 118.0 |
| 17 | −232.751 |  | 6.329 | SIO2 | 118.5 |
| 18 | 174.842 |  | 33.179 | HE | 127.9 |
| 19 | −135.497 |  | 10.857 | SIO2 | 132.8 |
| 20 | −567.373 | A | 11.495 | HE | 160.3 |
| 21 | −235.399 |  | 21.176 | SIO2 | 165.8 |
| 22 | −145.234 |  | 4.213 | HE | 175.6 |
| 23 | −1890.770 |  | 49.919 | CAF2 | 219.4 |
| 24 | −156.092 |  | 0.678 | HE | 224.3 |
| 25 | 340.445 |  | 66.046 | SIO2 | 255.5 |
| 26 | −383.246 |  | 0.680 | HE | 254.8 |
| 27 | 137.326 |  | 49.212 | CAF2 | 218.0 |
| 28 | 457.970 | A | 0.678 | HE | 209.9 |
| 29 | 147.683 |  | 15.743 | SIO2 | 181.5 |
| 30 | 120.693 |  | 37.797 | HE | 159.6 |
| 31 | −420.368 |  | 6.329 | SIO2 | 159.6 |
| 32 | 139.505 |  | 25.622 | HE | 140.7 |
| 33 | −378.597 |  | 6.329 | SIO2 | 140.7 |
| 34 | 167.539 |  | 39.624 | HE | 139.8 |
| 35 | −112.503 |  | 8.239 | SIO2 | 139.8 |
| 36 | 504.607 |  | 18.193 | HE | 174.3 |
| 37 | −369.374 |  | 15.678 | SIO2 | 174.6 |
| 38 | −205.396 |  | 1.373 | HE | 181.7 |
| 39 | −1692.687 |  | 31.888 | CAF2 | 214.3 |
| 40 | −220.732 |  | 1.536 | HE | 220.3 |
| 41 | 1213.241 |  | 32.223 | CAF2 | 256.7 |
| 42 | −430.691 |  | 0.692 | HE | 259.4 |
| 43 | 735.809 |  | 63.006 | CAF2 | 274.9 |
| 44 | −355.045 |  | 9.223 | HE | 278.5 |
| 45 | ∞ |  | 0.633 | HE | 271.7 |
| AS | ∞ |  | 0.000 | HE | 271.7 |
| 46 | 1056.085 |  | 20.400 | CAF2 | 272.1 |
| 47 | −5047.421 |  | 0.792 | HE | 271.5 |
| 48 | 260.901 |  | 46.828 | CAF2 | 266.8 |
| 49 | −1697.534 |  | 23.712 | HE | 264.5 |
| 50 | −317.482 |  | 10.850 | SIO2 | 264.5 |
| 51 | −488.982 |  | 8.402 | HE | 262.0 |
| 52 | −339.784 |  | 13.562 | SIO2 | 262.0 |
| 53 | −295.518 |  | 0.718 | HE | 261.9 |
| 54 | 152.565 |  | 37.779 | CAF2 | 213.7 |
| 55 | 505.038 |  | 3.020 | HE | 208.6 |
| 56 | 116.772 |  | 28.279 | SIO2 | 168.9 |
| 57 | 258.363 |  | 16.383 | HE | 160.8 |
| 58 | −5272.757 | A | 10.966 | SIO2 | 154.6 |
| 59 | 323.933 |  | 0.897 | HE | 133.4 |
| 60 | 142.873 |  | 27.124 | CAF2 | 121.2 |
| 61 | ∞ |  | 8.137 | AIR | 102.4 |
| 62 | ∞ |  | 18.083 | CAF2 | 76.0 |
| 63 | ∞ |  | 12.000 | AIR | 51.1 |
| Im |  |  |  |  |  |

Aspheric formula:

$$z = \frac{\frac{1}{R}h^2}{1+\sqrt{1-(1-EX)\left(\frac{1}{R}\right)^2 h^2}} + \sum_{k=1} c_k h^{2k+2}$$

z being the sagitta; h being the height; R being the radius; EX being the eccentricity; and $C_k$ being the aspherical constant.

Aspheric at Surface 3
RADIUS=−1393.13098
EX=0.0000000000
C 1=0.4063752600E−07
C 2=0.2071817000E−11
C 3=−0.6785322600E−16
C 4=0.1029460700E−18
C 5=−0.2998039200E−22
C 6=0.3527081700E−26

Aspheris at Surface 12
RADIUS=−16545.56046
EX=−43143.0300000000
C 1=−0.4810999900E−07
C 2=0.4047924800E−11
C 3=−0.8963528600E−16
C 4=0.8505763100E−20
C 5=−0.2882210400E−23
C 6=0.5453287000E−27

Aspheris at Surface 20
RADIUS=−567.37264
EX=0.0000000000
C 1=−0.3925583500E−08
C 2=−0.1562788800E−11
C 3=−0.1025893700E−16
C 4=−0.2599978800E−20
C 5=0.8906747700E−25
C 6=−0.3796689800E−28

Aspheric at Surface 28
RADIUS=457.96974
EX=0.0000000000
C 1=0.6773315100E−08
C 2=−0.3998553500E−12
C 3=−0.1364056800E−16
C 4=−0.1474625900E−21
C 5=−0.2509622300E−25
C 6=0.1507291900E−29

Aspheris at Surface 58
RADIUS=−5272.75688
EX=0.0000000000
C 1=−0.1963426400E−07
C 2=−0.2768505300E−12
C 3=0.1262120200E−15
C 4=−0.1811119000E−19
C 5=0.1171493900E−23
C 6=−0.3104888900E−28

Example according to FIG. 6:

Operating wavelength l = 248.4 nm
Diameter of the image field = 27.2 mm
Image-side numerical aperture NA = 0.8
Reduction ratio β = −0.25
n(SIO2) = 1.508

| Surface | Radius | Aspheric | Thickness | Material | Diameter |
|---|---|---|---|---|---|
| OB | ∞ | | 32.000 | AIR | |
| 1 | ∞ | | 4.253 | AIR | 121.9 |
| 2 | −1143.702 | | 7.789 | SIO2 | 122.9 |
| 3 | 366.821 | | 11.482 | AIR | 127.5 |
| 4 | 249.157 | | 23.794 | SIO2 | 138.2 |
| 5 | −289.424 | | 0.750 | AIR | 139.4 |
| 6 | 329.633 | | 18.667 | SIO2 | 140.7 |
| 7 | −444.218 | | 0.750 | AIR | 140.2 |
| 8 | 268.864 | | 16.633 | SIO2 | 135.5 |
| 9 | 1167.441 | A | 0.750 | AIR | 131.9 |
| 10 | 360.081 | | 8.628 | SIO2 | 129.2 |
| 11 | 118.445 | | 21.270 | AIR | 120.1 |
| 12 | −775.270 | | 7.000 | SIO2 | 119.7 |
| 13 | 156.713 | | 23.965 | AIR | 118.8 |
| 14 | −190.304 | | 7.000 | SIO2 | 119.8 |
| 15 | 266.520 | | 27.800 | AIR | 131.4 |
| 16 | −141.408 | | 7.149 | SIO2 | 134.4 |
| 17 | 2327.162 | A | 7.878 | AIR | 162.8 |
| 18 | −999.626 | | 32.538 | SIO2 | 169.4 |
| 19 | −148.399 | | 0.750 | AIR | 177.5 |
| 20 | −1179.797 | A | 40.792 | SIO2 | 207.1 |
| 21 | −190.467 | | 0.750 | AIR | 215.0 |
| 22 | 506.448 | | 42.194 | SIO2 | 236.0 |
| 23 | −318.978 | | 0.750 | AIR | 236.6 |
| 24 | 156.565 | | 61.867 | SIO2 | 220.3 |
| 25 | −1909.591 | A | 0.750 | AIR | 209.4 |
| 26 | 305.588 | | 22.962 | SIO2 | 186.3 |
| 27 | 178.412 | | 27.808 | AIR | 157.7 |
| 28 | −441.206 | | 7.000 | SIO2 | 154.8 |
| 29 | 141.453 | | 34,534 | AIR | 138.2 |
| 30 | −176.778 | | 7.000 | SIO2 | 137.5 |
| 31 | 204.086 | | 40,524 | AIR | 141.8 |
| 32 | −114.660 | | 7.000 | SIO2 | 143.5 |
| 33 | 1254.417 | | 16.848 | AIR | 176.1 |
| 34 | −386.520 | | 31.318 | SIO2 | 181.6 |
| 35 | −187.128 | | 0.750 | AIR | 198.8 |
| 36 | −7551.297 | | 32.372 | SIO2 | 235.1 |
| 37 | −271.610 | | 0.750 | AIR | 239.3 |
| 38 | 985.139 | | 48.181 | SIO2 | 264.8 |
| 39 | −280.307 | | 0.750 | AIR | 266.7 |
| 40 | 485.845 | | 42.861 | SIO2 | 265.0 |
| 41 | −19641.172 | | 0.750 | AIR | 260.0 |
| 42 | ∞ | | 0.750 | AIR | 259.6 |
| AS | ∞ | | 0.000 | AIR | 259.6 |
| 43 | 413.812 | | 31.899 | SIO2 | 258.5 |
| 44 | −1463.530 | | 41.090 | AIR | 257.1 |
| 45 | −229.000 | | 7.000 | SIO2 | 252.9 |
| 46 | −761.338 | | 16.518 | AIR | 258.2 |
| 47 | −346.924 | | 22.741 | SIO2 | 258.3 |
| 48 | −221.418 | | 0.750 | AIR | 260.0 |
| 49 | 265.978 | | 21.446 | SIO2 | 240.4 |
| 50 | 700.398 | | 0.750 | AIR | 238.8 |
| 51 | 203.760 | | 28.367 | SIO2 | 224.4 |
| 52 | 565.063 | | 0.750 | AIR | 219.8 |
| 53 | 124.657 | | 33.574 | SIO2 | 185.9 |
| 54 | 255.790 | | 3.089 | AIR | 175.4 |
| 55 | 192.512 | | 17.352 | SIO2 | 164.2 |
| 56 | 490.117 | A | 9.135 | AIR | 155.9 |
| 57 | ∞ | | 57.580 | SIO2 | 148.9 |
| 58 | ∞ | | 2.600 | AIR | 76.6 |
| 59 | ∞ | | 8.069 | SIO2 | 69.6 |
| 60 | ∞ | | 12.000 | AIR | 59.5 |
| IM | | | | | |

Aspheric formula:

$$z = \frac{\frac{1}{R}h^2}{1+\sqrt{1-(1-EX)\left(\frac{1}{R}\right)^2 h^2}} + \sum_{k=1} c_k h^{2k+2}$$

z being the sagitta; h being the height; R being the radius; EX being the eccentricity; and $C_k$ being the aspherical constant.

Aspheric at Surface 9
RADIUS=1167.44078
EX=−148.8088700000
C 1=−0.3810274500E−07
C 2=0.1825110100E−11
C 3=0.8703118800E−16
C 4=−0.2547944400E−19
C 5=0.2618280200E−23
C 6=−0.7405173000E−28

Aspheric at Surface 17
RADIUS=2327.16189
EX=−543.6641800000
C 1=0.1496899300E−07
C 2=−0.4053465300E−11
C 3=−0.3692162500E−16
C 4=0.1322169800E−19
C 5=−0.7575130800E−24
C 6=−0.1121083700E−27

Aspheric at Surface 20
RADIUS=−1179.79732
EX=88.7124390000
C 1=0.5780601700E−08
C 2=0.2633543200E−12
C 3=−0.3666325900E−16
C 4=0.7930956500E−21
C 5=−0.7002646400E−26
C 6=−0.4010891200E−29

Aspheric at Surface 25
RADIUS=−1909.59064
EX=0.0000000000
C 1=0.5895489200E−08
C 2=0.4254414900E−13
C 3=−0.4954342300E−18
C 4=−0.9017812800E−21
C 5=0.3307499000E−25
C 6=−0.5028285900E−30

Aspheric at Surface 56
RADIUS=490.11681
EX=−4.7440051000
C 1=0.6613898200E−08
C 2=−0.9371994200E−12
C 3=0.7675398100E−16
C 4=−0.9919946900E−20
C 5=0.9420632400E−24
C 6=−0.4092113200E−28

Example according to FIG. 7:

Operating wavelength l = 193.3 nm
Diameter of the image field = 24.6 mm
Image-side numerical aperture NA = 0.85
Reduction ratio β = 0.25
Refractive index n(SIO2) = 1.5603
Refractive index n(CAF2) = 1.5014

| Surface | Radius | Aspheric | Thickness | Material | Diameter |
|---|---|---|---|---|---|
| OB | | | 32.000 | AIR | |
| 1 | ∞ | | 6.329 | SIO2 | 110.8 |
| 2 | ∞ | | 1.383 | HE | 112.5 |
| 3 | −1393.131 | A | 6.329 | SIO2 | 112.8 |
| 4 | 153.737 | | 14.539 | HE | 118.0 |
| 5 | 191.890 | | 23.775 | SIO2 | 135.0 |
| 6 | −359.189 | | 0.678 | HE | 136.5 |
| 7 | −827.276 | | 7.196 | SIO2 | 137.7 |
| 8 | −475.714 | | 0.678 | HE | 138.8 |
| 9 | 296.346 | | 18.036 | SIO2 | 141.7 |
| 10 | −561.014 | | 0.678 | HE | 141.4 |
| 11 | 183.662 | | 19.090 | SIO2 | 137.2 |
| 12 | −16545.560 | A | 0.694 | HE | 135.1 |
| 13 | 326.464 | | 6.329 | SIO2 | 129.2 |
| 14 | 106.348 | | 27.957 | HE | 118.2 |
| 15 | −235.452 | | 6.329 | SIO2 | 117.5 |
| 16 | 304.109 | | 15.255 | HE | 118.0 |
| 17 | −232.751 | | 6.329 | SIO2 | 118.5 |
| 18 | 174.842 | | 33.179 | HE | 127.9 |
| 19 | −135.497 | | 10.857 | SIO2 | 132.8 |
| 20 | −567.373 | A | 11.495 | HE | 160.3 |
| 21 | −235.399 | | 21.176 | SIO2 | 165.8 |
| 22 | −145.234 | | 4.213 | HE | 175.6 |
| 23 | −1890.770 | | 49.919 | CAF2 | 219.4 |
| 24 | −156.092 | | 0.678 | HE | 224.3 |
| 25 | 340.445 | | 66.046 | SIO2 | 255.5 |
| 26 | −383.246 | | 0.680 | HE | 254.8 |
| 27 | 137.326 | | 49.212 | CAF2 | 218.0 |
| 28 | 457.970 | A | 0.678 | HE | 209.9 |
| 29 | 147.683 | | 15.743 | SIO2 | 181.5 |
| 30 | 120.693 | | 37.797 | HE | 159.6 |
| 31 | −420.368 | | 6.329 | SIO2 | 159.6 |
| 32 | 139.505 | | 25.622 | HE | 140.7 |
| 33 | −378.597 | | 6.329 | SIO2 | 140.7 |
| 34 | 167.539 | | 39.624 | HE | 139.8 |
| 35 | −112.503 | | 8.239 | SIO2 | 139.8 |
| 36 | 504.607 | | 18.193 | HE | 174.3 |
| 37 | −369.374 | | 15.678 | SIO2 | 174.6 |
| 38 | −205.396 | | 1.373 | HE | 181.7 |
| 39 | −1692.687 | | 31.888 | CAF2 | 214.3 |
| 40 | −220.732 | | 1.536 | HE | 220.3 |
| 41 | 1213.241 | | 32.223 | CAF2 | 256.7 |
| 42 | −430.691 | | 0.692 | HE | 259.4 |
| 43 | 735.809 | | 63.006 | CAF2 | 274.9 |
| 44 | −355.045 | | 9.223 | HE | 278.5 |
| 45 | ∞ | | 0.633 | HE | 271.7 |
| AS | ∞ | | 0.000 | HE | 271.7 |
| 46 | 1056.085 | | 20.400 | CAF2 | 272.1 |
| 47 | −5047.421 | | 0.792 | HE | 271.5 |
| 48 | 260.901 | | 46.828 | CAF2 | 266.8 |
| 49 | −1697.534 | | 23.712 | HE | 264.5 |
| 50 | −317.482 | | 10.850 | SIO2 | 264.5 |
| 51 | −488.982 | | 8.402 | HE | 262.0 |
| 52 | −339.784 | | 13.562 | SIO2 | 262.0 |
| 53 | −295.518 | | 0.718 | HE | 261.9 |
| 54 | 152.565 | | 37.779 | CAF2 | 213.7 |
| 55 | 505.038 | | 3.020 | HE | 208.6 |
| 56 | 116.772 | | 28.279 | SIO2 | 168.9 |
| 57 | 258.363 | | 16.383 | HE | 160.8 |
| 58 | −5272.757 | A | 10.966 | SIO2 | 154.6 |
| 59 | 323.933 | | 0.897 | HE | 133.4 |
| 60 | 142.873 | | 45.207 | CAF2 | 121.2 |
| 61 | ∞ | | 20.137 | AIR | 102.4 |
| Im | | | | | |

Aspheric formula:

$$z = \frac{\frac{1}{R}h^2}{1+\sqrt{1-(1-EX)\left(\frac{1}{R}\right)^2 h^2}} + \sum_{k=1} c_k h^{2k+2}$$

z being the sagitta; h being the height; R being the radius; EX being the eccentricity; and $C_k$ being the aspherical constant.

Aspheric at Surface 3
RADIUS=−1393.13098
EX=0.0000000000
C 1=0.4063752600E−07
C 2=0.2071817000E−11
C 3=−0.6785322600E−16
C 4=0.1029460700E−18
C 5=−0.2998039200E−22
C 6=0.3527081700E−26

Aspheric at Surface 12
RADIUS=−16545.56046
EX=−43143.0300000000
C 1=−0.4810999900E−07
C 2=0.4047924800E−11
C 3=−0.8963528600E−16
C 4=0.8505763100E−20
C 5=−0.2882210400E−23
C 6=0.5453287000E−27

Aspheric at Surface 20
RADIUS=−567.37264
EX=0.0000000000
C 1=−0.3925583500E−08
C 2=−0.1562788800E−11
C 3=−0.1025893700E−16
C 4=−0.2599978800E−20
C 5=0.8906747700E−25
C 6=−0.3796689800E−28

Aspheric at Surface 28
RADIUS=457.96974
EX=0.0000000000
C 1=0.6773315100E−08
C 2=−0.3998553500E−12
C 3=−0.1364056800E−16
C 4=−0.1474625900E−21
C 5=−0.2509622300E−25
C 6=0.1507291900E−29

Aspheric at Surface 58
RADIUS=−5272.75688
EX=0.0000000000
C 1=−0.1963426400E−07
C 2=0.2768505300E−12
C 3=0.1262120200E−15
C 4=−0.1811119000E−19
C 5=0.1171493900E−23
C 6=−0.3104888900E−28

Example according to FIG. 8:

Operating wavelength l = 248.4 nm
Diameter of the image field = 27.2 mm
Image-side numerical aperture NA = 0.8
Reduction ratio β = −0.25
n(SIO2) = 1.5084

| Surface | Radius | Aspheric | Thickness | Material | Diameter |
|---|---|---|---|---|---|
| OB | ∞ | | 32.000 | AIR | |
| 1 | ∞ | | 4.253 | AIR | 121.9 |
| 2 | −1143.702 | | 7.789 | SIO2 | 122.9 |
| 3 | 366.821 | | 11.482 | AIR | 127.5 |
| 4 | 249.157 | | 23.794 | SIO2 | 138.2 |
| 5 | −289.424 | | 0.750 | AIR | 139.4 |
| 6 | 329.633 | | 18.667 | SIO2 | 140.7 |
| 7 | −444.218 | | 0.750 | AIR | 140.2 |
| 8 | 268.864 | | 16.633 | SIO2 | 135.5 |
| 9 | 1167.441 | A | 0.750 | AIR | 131.9 |
| 10 | 360.081 | | 8.628 | SIO2 | 129.2 |
| 11 | 118.445 | | 21.270 | AIR | 120.1 |
| 12 | −775.270 | | 7.000 | SIO2 | 119.7 |
| 13 | 156.713 | | 23.965 | AIR | 118.8 |
| 14 | −190.304 | | 7.000 | SIO2 | 119.8 |
| 15 | 266.520 | | 27.800 | AIR | 131.4 |
| 16 | −141.408 | | 7.149 | SIO2 | 134.4 |
| 17 | 2327.162 | A | 7.878 | AIR | 162.8 |
| 18 | −999.626 | | 32.538 | SIO2 | 169.4 |
| 19 | −148.399 | | 0.750 | AIR | 177.5 |
| 20 | −1179.797 | A | 40.792 | SIO2 | 207.1 |
| 21 | −190.467 | | 0.750 | AIR | 215.0 |
| 22 | 506.448 | | 42.194 | SIO2 | 236.0 |
| 23 | −318.978 | | 0.750 | AIR | 236.6 |
| 24 | 156.565 | | 61.867 | SIO2 | 220.3 |
| 25 | −1909.591 | A | 0.750 | AIR | 209.4 |
| 26 | 305.588 | | 22.962 | SIO2 | 186.3 |
| 27 | 178.412 | | 27.808 | AIR | 157.7 |
| 28 | −441.206 | | 7.000 | SIO2 | 154.8 |
| 29 | 141.453 | | 34.534 | AIR | 138.2 |
| 30 | −176.778 | | 7.000 | SIO2 | 137.5 |
| 31 | 204.086 | | 40.524 | AIR | 141.8 |
| 32 | −114.660 | | 7.000 | SIO2 | 143.5 |
| 33 | 1254.417 | | 16.848 | AIR | 176.1 |
| 34 | −386.520 | | 31.318 | SIO2 | 181.6 |
| 35 | −187.128 | | 0.750 | AIR | 198.8 |
| 36 | −7551.297 | | 32.372 | SIO2 | 235.1 |
| 37 | −271.610 | | 0.750 | AIR | 239.3 |
| 38 | 985.139 | | 48.181 | SIO2 | 264.8 |
| 39 | −280.307 | | 0.750 | AIR | 266.7 |
| 40 | 485.845 | | 42.861 | SIO2 | 265.0 |
| 41 | −19641.172 | | 0.750 | AIR | 260.0 |
| 42 | ∞ | | 0.750 | AIR | 259.6 |
| AS | ∞ | | 0.000 | AIR | 259.6 |
| 43 | 413.812 | | 31.899 | SIO2 | 258.5 |
| 44 | −1463.530 | | 41.090 | AIR | 257.1 |
| 45 | −229.000 | | 7.000 | SIO2 | 252.9 |
| 46 | −761.338 | | 16.518 | AIR | 258.2 |
| 47 | −346.924 | | 22.741 | SIO2 | 258.3 |
| 48 | −221.418 | | 0.750 | AIR | 260.0 |
| 49 | 265.978 | | 21.446 | SIO2 | 240.4 |
| 50 | 700.398 | | 0.750 | AIR | 238.8 |
| 51 | 203.760 | | 28.367 | SIO2 | 224.4 |
| 52 | 565.063 | | 0.750 | AIR | 219.8 |
| 53 | 124.657 | | 33.574 | SIO2 | 185.9 |
| 54 | 255.790 | | 3.089 | AIR | 175.4 |
| 55 | 192.512 | | 17.352 | SIO2 | 164.2 |
| 56 | 490.117 | A | 9.135 | AIR | 155.9 |
| 57 | ∞ | | 65.649 | SIO2 | 148.9 |
| 58 | ∞ | | 14.600 | AIR | 76.6 |
| IM | | | | | |

Aspheric formula:

$$z = \frac{\frac{1}{R}h^2}{1+\sqrt{1-(1-EX)\left(\frac{1}{R}\right)^2 h^2}} + \sum_{k=1} c_k h^{2k+2}$$

z being the sagitta; h being the height; R being the radius; EX being the eccentricity; and $C_k$ being the aspherical constant.

Aspheric at Surface 9
RADIUS=1167.44078
EX=−148.8088700000
C 1=−0.3810274500E-07
C 2=0.1825110100E-11
C 3=0.8703118800E-16
C 4=−0.254794400E-19
C 5=0.2618280200E-23
C 6=−0.7405173000E-28

Aspheric at Surface 17
RADIUS=2327.16189
EX=−543.6641800000
C 1=0.1496899300E-07
C 2=−0.4053465300E-11
C 3=−0.3692162500E-16
C 4=0.1322169800E-19
C 5=−0.7575130800E-24
C 6=−0.1121083700E-27

Aspheric at Surface 20
RADIUS=−1179.79732
EX=88.7124390000
C 1=0.5780601700E-08
C 2=0.2633543200E-12
C 3=−0.3666325900E-16
C 4=0.7930956500E-21
C 5=−0.7002646400E-26
C 6=−0.4010891200E-29

Aspheric at Surface 25
RADIUS=−1909.59064
EX=0.0000000000
C 1=0.5895489200E-08
C 2=0.4254414900E-13
C 3=−0.4954342300E-18
C 4=−0.9017812800E-21
C 5=0.3307499000E-25
C 6=−0.5028285900E-30

Aspheric at Surface 56
RADIUS=490.11681
EX=−4.7440051000
C 1=0.6613898200E-08
C 2=−0.9371994200E-12
C 3=0.7675398100E-16
C 4=−0.9919946900E-20
C 5=0.9420632400E-24
C 6=−0.4092113200E-28

What is claimed is:

1. Projection exposure machine in microlithography comprising a projection lens with a lens arrangement and at least one stop, said lens arrangement comprising a group of optical elements which is arranged between said stop and an image plane, wherein an optical element of said group which is situated near said image plane having a thickness of at least 6.5% of the entire stop diameter.

2. Projection exposure machine according to claim 1, wherein said optical element has a thickness of at least 16.5% of the entire stop diameter.

3. Projection exposure machine according to claim 1, said optical element has a thickness of at least 22% of the entire stop diameter.

4. Projection exposure machine according to claim 1, wherein said optical element is an optical element of the group which is situated closest to said image plane.

5. Projection exposure machine according to claim 1, wherein said optical element is a second-last optical element of said group which is situated closest to said image plane.

6. Projection exposure machine according to claim 4 or 5, wherein said optical element has a plane surface facing the image field.

7. Projection exposure machine according to claim 4 or 5, wherein said optical element has a convex or plane surface averted from said image field.

8. Projection exposure machine according to claim 4 or 5, wherein said optical element is a piano-convex lens.

9. Projection exposure machine according to claim 4 or 5, wherein said optical element is a plane-parallel plate.

10. Projection exposure machine according to claim 4 or 5, wherein said optical element is a combination of a plano-convex optical element with a plane-parallel plate.

11. Projection exposure machine according to claim 1, wherein said optical element has radii of curvature R1 and R2, a thickness d1 and a diameter DU1, wherein it applies that |R1|>3000 mm, |R2|>3000 mm and $$\frac{d1}{DU1} > \frac{1}{5}.$$

12. Projection exposure machine according to claim 11, wherein it applies that |R1|>5000 mm and |R2|>5000 mm.

13. Projection exposure machine according to claim 11, wherein it applies that $$\frac{d1}{DU1} > \frac{1}{4}, \text{ preferably } \frac{d1}{DU1} > \frac{1}{3}.$$

14. Projection exposure machine according to claim 1, wherein said
projection lens comprises
a first lens group of positive refractive power,
a second lens group of negative refractive power,
a third lens group of positive refractive power,
a fourth lens group of negative refractive power,
a fifth lens group of positive refractive power, and
a sixth optical group.

15. Projection exposure machine according to claim 14, wherein said optical element is arranged in said sixth optical group.

16. Projection exposure machine according to claim 14, wherein an optical element with optical refractive power is provided in said first lens group.

17. Projection exposure machine according to claim 16, wherein said optical element with optical refractive power is situated closest to an object field.

18. Projection exposure machine according to claim 17, wherein said optical element with optical refractive power has an aspheric.

19. Projection exposure machine according to claim 18, wherein said aspheric of said optical element with optical refractive power in said first lens group faces said object field.

20. Projection exposure machine according to claim 16, wherein a further optical element with an aspheric is provided in said first lens group.

21. Projection exposure machine according to claim 14, wherein an optical element with an aspheric is provided in said second lens group.

22. Projection exposure machine according to claim 14, wherein an optical element with an aspheric is provided in said third lens group.

23. Projection exposure machine according to claim 14, wherein an optical element with an aspheric is provided in said sixth optical group.

24. Projection exposure machine according to claim 14, characterized in that wherein at least one optical element with optical refractive power is provided in said first lens group.

25. Projection exposure machine according to claim 24, wherein said optical element with optical refractive power has an aspheric.

26. Projection exposure machine according to claim 14, wherein at least one optical element with an aspheric is provided in said second lens group.

27. Projection exposure machine according to claim 14, wherein at least one optical element with an aspheric is provided in said third lens group.

28. Projection exposure machine according to claim 14, wherein at least one optical element with an aspheric is provided in said fifth lens group.

29. Projection exposure machine according to claim 14, wherein optical elements which have a refractive index n<1.6 are provided in said sixth optical group.

30. Projection exposure machine according to claim 14, wherein a first optical element and a second optical element of said sixth optical group enclose a gas chamber, wherein it applies for the radius of curvature R3 of a first surface of said second optical element, which faces said first optical element, that:

$|R3|>3000$ mm.

31. Projection exposure machine according to claim 30, wherein it applies for the radius of curvature R3 that:

$|R3|>5000$ mm.

32. Projection exposure machine according to claim 30, wherein it applies for the radius of curvature R4 of a second surface of said second optical element that:

$|R4|>3000$ mm.

33. Projection exposure machine according to claim 30, wherein said second optical element has a thickness d2, wherein it applies that:

$d1+d2>60.0$ mm.

34. Projection exposure machine according to claim 19, wherein said optical element having optical refractive power and said aspheric is arranged upstream of the first bulge in the light direction.

35. Projection exposure machine according to claim 34, wherein said aspheric is arranged on a first curved surface of an optical element.

36. Projection exposure machine according to claim 1, wherein said optical element has a transmission of less than 300 nm.

37. Projection exposure machine according to claim 1, characterized by a numerical aperture on the image side of at least 0.75, preferably 0.85.

38. Projection exposure machine in microlithography comprising a projection lens with a lens arrangement and at least one stop, said lens arrangement comprises a group of optical elements with a refractive index n<1.6 which is arranged between said stop and an image plane, an optical element of said group which is situated near said image plane having a thickness of at least 6.5% of the entire stop diameter.

39. Projection exposure machine comprising a projection lens said projection lens comprising a first lens group of positive refraction power, a second lens group of negative refractive power, a third lens group of positive refractive power, a fourth lens group of negative refractive power, a fifth lens group of positive refractive power, and a sixth optical group, and moving an optical element which is constructed as an optical element in said first lens group with optical refractive power, and is situated closest to an object plane and has an aspheric.

40. Projection exposure machine according to claim 39, wherein said aspheric faces said object plane.

41. Projection exposure machine according to claim 39, wherein said aspheric is the first curved surface of said first lens group.

42. Projection exposure machine according to claim 39, wherein a further aspheric is additionally provided in said first lens group.

43. Projection exposure machine according to claim 39, wherein a further aspheric is additionally provided in said second lens group.

44. Projection exposure machine according to claim 39, wherein a further aspheric is additionally provided in said third lens group.

45. Projection exposure machine according to claim 39, wherein a further aspheric is additionally provided in said sixth optical group.

46. Projection exposure machine according to claim 39, wherein an aspheric is additionally provided in said first lens group and in said second lens group.

47. Projection exposure machine according to claim 39, wherein an aspheric is additionally provided in said first lens group, said second lens group and said third lens group.

48. Projection exposure machine according to claim 39, wherein an aspheric is additionally provided in said first lens group, said second lens group, said third lens group and said sixth optical group.

49. Projection exposure machine according to claim 39, wherein an aspheric is additionally provided in said first lens group and said third lens group.

50. Projection exposure machine according to claim 39, wherein an aspheric is additionally provided in said first lens group, said third lens group and said sixth optical group.

51. Projection exposure machine according to claim 39, wherein an aspheric is additionally provided in said first lens group and said sixth optical group.

52. Projection exposure machine according to claim 39, wherein an aspheric is additionally provided in said second lens group and said third lens group.

53. Projection exposure machine according to claim 39, wherein an aspheric is additionally provided in said second lens group, said third lens group and said sixth optical group.

54. Projection exposure machine according to claim 39, wherein an aspheric is additionally provided in said third lens group and said sixth optical group.

55. Projection exposure machine according to claim 39, wherein an aspheric is additionally provided on an optical element which is the last optical element with optical refractive power.

56. Projection exposure machine according to claim 55, wherein said aspheric faces said image plane.

57. Projection exposure machine according to claim 39, wherein an aspheric is additionally provided on a last surface, which faces said image plane, of an optical element with optical refractive power.

58. Projection exposure machine according to claim 39, wherein said aspheric is the last curved surface of said first lens group.

59. Projection exposure machine according to claim 58, wherein a further aspheric is additionally provided in said fifth lens group.

60. Projection exposure machine according to claim 58, wherein an aspheric is additionally provided in said second lens group, at least one aspheric is provided in said third lens group, and an aspheric is provided in said fifth lens group.

61. Projection exposure machine according to claim 58, wherein at least one aspheric is additionally provided in said third lens group and an aspheric is provided in said fifth lens group.

62. Projection exposure machine comprising a projection lens having a first lens group of positive refractive power, a second lens group of negative refractive power, a third lens group of positive refractive power, a fourth lens group of negative refractive power, a fifth lens group of positive refractive power, and a sixth optical group, and comprising an optical element in said fifth lens group which is constructed as an optical element with optical refractive power, is situated closest to an image plane and has an aspheric.

63. Projection exposure machine according to claim 62, wherein said aspheric faces said image plane.

64. Projection exposure machine according to claim 62, wherein said aspheric is the last curved surface of said fifth lens group.

65. Projection exposure machine according to claim 64, wherein a further aspheric is additionally provided in said first lens group.

66. Projection exposure machine according to claim 64, wherein a further aspheric is additionally provided in said second lens group.

67. Projection exposure machine according to claim 64, wherein at least one aspheric is additionally provided in said third lens group.

68. Projection exposure machine according to claim 64, wherein an aspheric is additionally provided in said first lens group and said second lens group.

69. Projection exposure machine according to claim 64, wherein an aspheric is additionally provided in said first lens group and in said second lens group, and at least one aspheric is provided in said third lens group.

70. Projection exposure machine according to claim 64, wherein an aspheric is additionally provided in said first lens group, and at least one aspheric is provided in said third lens group.

71. Projection exposure machine according to claim 64, wherein an aspheric is additionally provided in said second lens group, and at least one aspheric is provided in said third lens group.

72. Projection exposure machine according to claim 64, wherein an aspheric is additionally provided on an optical element which is the last optical element with optical refractive power of said first lens group.

73. Projection exposure machine according to claim 72, wherein the aspheric faces said image plane.

74. Method for tuning a projection exposure machine comprising a projection lens, including the steps of changing the refractive index in a manipulation chamber of said projection lens by changing a gas composition in such a way that the optical effect of said manipulation chamber and of a space between a last optical element of said projection lens and an image plane corresponds to the location of use wherein said manipulation chamber is between a penultimate and the last optical element and is filled with a gas, said manipulation chamber being manipulated using the relationship $d_1 \cdot n_1 + d_2 \cdot n_2 = d_1 \cdot n_3 + d_2 \cdot n_4$, $d_1$ being the thickness of said manipulation chamber, $d_2$ being the thickness of said space between said last optical element of said projection lens and said image plane, $n_1$ being the refractive index of the gas in said manipulation chamber at the manufacturing location, $n_2$ being the refractive index of the gas in said space between said last optical element of said projection lens and said image plane at the manufacturing location, $n_3$ being the refractive index of the gas in said manipulation chamber at the location of use, and $n_4$ being the refractive index of the gas in said space between said last optical element of said projection lens and said image plane at the location of use.

75. Method according to claim 74, wherein said manipulation chamber is of virtually plane-parallel construction.

* * * * *

UNITED STATES PATENT AND TRADEMARK OFFICE
CERTIFICATE OF CORRECTION

PATENT NO. : 7,203,007 B2  Page 1 of 1
APPLICATION NO. : 10/915972
DATED : April 10, 2007
INVENTOR(S) : Schuster It is certified that error appears in the above-identified patent and that said Letters Patent is hereby corrected as shown below:

Column 9, line 37
Please delete "... varied by, pressure ..." and insert --... varied by pressure ...--

Column 11, line 25, 35, 47
Please delete "... Aspheris at Surface ..." and insert --... Aspheric at Surface ...--

Column 11, line 62
Please delete "... C2=-0.2768505300E-12 ..." and insert --... C2=0.2768505300E-12 ...--

Column 13, line 20
Please delete "... C4=-0.2.547944400E-19 ..." and insert --... C4=0.2547944400E-19 ...--

Column 18, line 22 (claim 8)
Please delete "... is a piano-convex ..." and insert --... is a plano-convex ...--

Signed and Sealed this

Sixth Day of November, 2007

JON W. DUDAS
*Director of the United States Patent and Trademark Office*